United States Patent
Chien et al.

(10) Patent No.: US 9,776,857 B2
(45) Date of Patent: Oct. 3, 2017

(54) METHODS OF FABRICATING MICRO ELECTRO MECHANICAL SYSTEM STRUCTURES

(71) Applicant: Taiwan Semiconductor Manufacturing Company, Ltd., Hsin-Chu (TW)

(72) Inventors: Ting-Ying Chien, Hsinchu (TW); Ching-Hou Su, Hsinchu (TW); Chyi-Tsong Ni, Hsinchu (TW); Yi Hsun Chiu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/860,067

(22) Filed: Sep. 21, 2015

(65) Prior Publication Data

US 2016/0009550 A1    Jan. 14, 2016

Related U.S. Application Data

(63) Continuation of application No. 13/353,765, filed on Jan. 19, 2012, now Pat. No. 9,139,423.

(51) Int. Cl.
*B81C 1/00* (2006.01)

(52) U.S. Cl.
CPC .. *B81C 1/00269* (2013.01); *B81C 2203/0109* (2013.01); *B81C 2203/019* (2013.01); *H01L 2224/83805* (2013.01); *H01L 2924/0002* (2013.01); *H01L 2924/16235* (2013.01)

(58) Field of Classification Search
None
See application file for complete search history.

(56) References Cited

U.S. PATENT DOCUMENTS

| | | | |
|---|---|---|---|
| 7,104,129 | B2 | 9/2006 | Nasiri et al. |
| 7,491,567 | B2 | 2/2009 | DCamp et al. |
| 7,705,413 | B2 | 4/2010 | Weber et al. |
| 7,960,208 | B2 | 6/2011 | Carlson et al. |
| 8,084,332 | B2 | 12/2011 | Nasiri et al. |
| 8,191,756 | B2 | 6/2012 | Coppeta et al. |
| 8,497,216 | B2 | 7/2013 | Mayer |

(Continued)

FOREIGN PATENT DOCUMENTS

| | | |
|---|---|---|
| CN | 1910486 | 2/2007 |
| CN | 102164847 | 8/2011 |

(Continued)

OTHER PUBLICATIONS

Definition of 'Trench' downloaded from URL <http://www.merriam-webster.com/dictionary/trench> on Mar. 29, 2016.*

(Continued)

*Primary Examiner* — Joseph Schoenholtz
(74) *Attorney, Agent, or Firm* — Haynes and Boone, LLP

(57) ABSTRACT

A method of fabricating a micro electro mechanical system (MEMS) structure includes providing a first substrate structure including a bonding pad structure. The bonding pad structure has at least one recess therein. A second substrate structure is provided and bonded with the bonding pad structure of the first substrate structure.

20 Claims, 9 Drawing Sheets

(56) References Cited

U.S. PATENT DOCUMENTS

| | | | |
|---|---|---|---|
| 8,575,748 B1* | 11/2013 | Farino | H01L 23/10 257/704 |
| 8,580,594 B2 | 11/2013 | Huang et al. | |
| 8,647,962 B2 | 2/2014 | Liu et al. | |
| 8,735,260 B2 | 5/2014 | Tsai et al. | |
| 8,736,081 B2 | 5/2014 | Foster et al. | |
| 9,054,121 B2 | 6/2015 | Liu et al. | |
| 2005/0077612 A1* | 4/2005 | Nikkel | B81C 1/00269 257/704 |
| 2005/0166677 A1* | 8/2005 | Nasiri | B81C 1/0023 73/514.16 |
| 2006/0115323 A1* | 6/2006 | Coppeta | A61K 9/0097 403/270 |
| 2007/0114643 A1* | 5/2007 | DCamp | B81B 7/0077 257/678 |
| 2008/0131662 A1 | 6/2008 | Jordan et al. | |
| 2010/0072555 A1 | 3/2010 | Meng et al. | |
| 2010/0283138 A1 | 11/2010 | Chen et al. | |
| 2012/0045628 A1 | 2/2012 | Gonska et al. | |
| 2012/0187509 A1* | 7/2012 | Gottfried | B81C 1/00238 257/417 |
| 2016/0009550 A1* | 1/2016 | Chien | B81C 1/00269 438/51 |

FOREIGN PATENT DOCUMENTS

| | | | |
|---|---|---|---|
| JP | 2013125912 A * | 6/2013 | H01L 23/10 |
| TW | 201131229 | 9/2011 | |

OTHER PUBLICATIONS

Definition of 'Slot' downloaded from URL <http://www.merriam-webster.com/dictionary/slot> on Mar. 29, 2016.*

Definition of 'Recess' downloaded from URL<http://www.merriam-webster.com/dictionary/recess> on Mar. 29, 2016.*

Definition of 'Interface' downloaded from URL<http://www.merriam-webster.com/dictionary/interface> on Mar. 30, 2016.*

Srinivasan, T., "Wafer-to-Wafer Bonding and Packaging", Lecture 25 EE C245, University of California, Berkeley, Jul. 29, 2007 downloaded from URL<https://web.archive.org/web/20070729183206/http://www-bsac.eecs.berkeley.edu/projects/ee245/Lectures/lecturepdfs/Lecture%2025%20Wafer%20Bonding%20and%20Packaging.pdf> on Feb. 14, 2017.*

Wayback Time Machine for Srinivasan, T. "Wafer-to-Wafer Bonding for Bonding and Packaging" EECS 245 Lecture 25.*

Dragoi, V., et al. "Wafer Bonding with Metal Layer for MEMS Applications", IEEE 2009, pp. 215-248.

Farrens, Dr. Shari, "Bonding with Ali Metallurgies", Suss Micro Tec, 228 Suss Drive, Waterbury Center, VT, USA 05677, 5 pages.

Jing, Errong, et al., "The Bond Strength of Au/Si Eutectic Bonding Studied by IR Microscopes", IEEE Transactions on Electronics Packaging Manufacturing, vol. 33, No. 1, Jan. 2010, pp. 31-37.

* cited by examiner

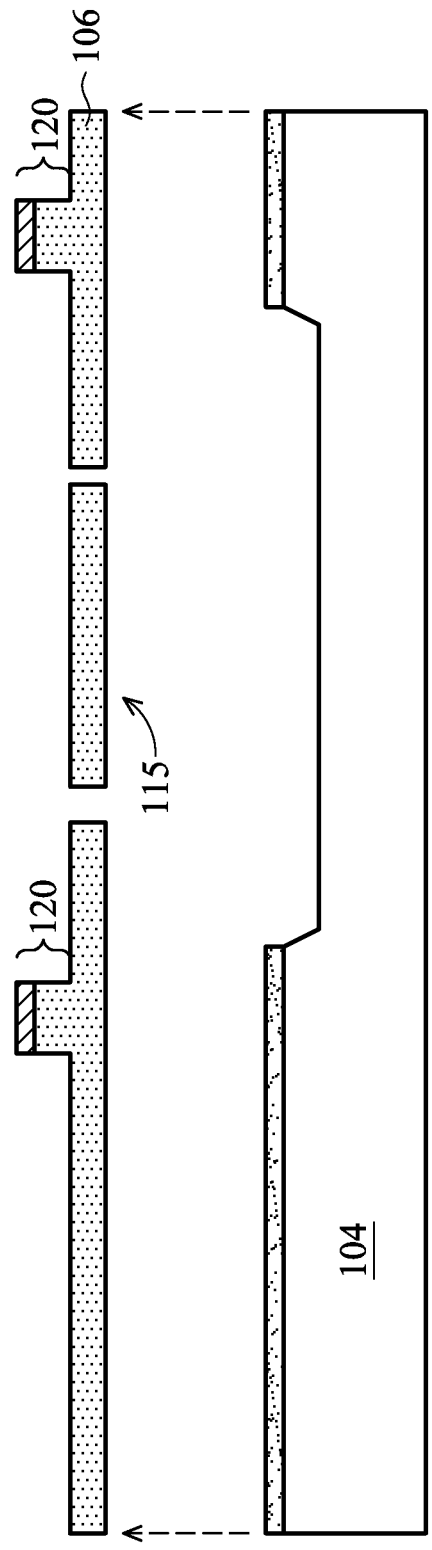
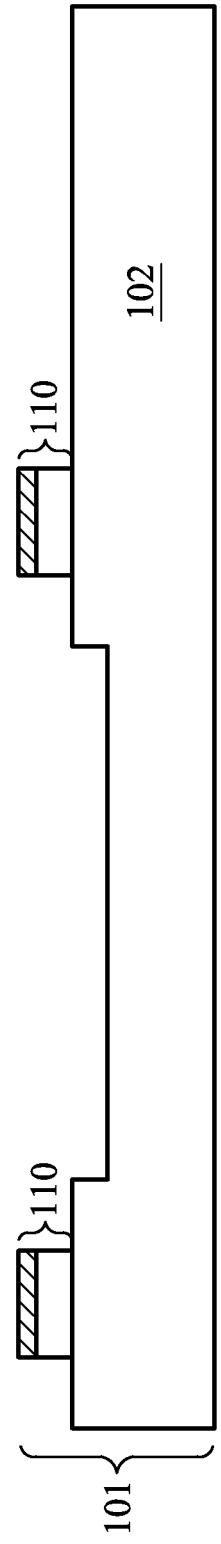
FIG. 8A
FIG. 8B

METHODS OF FABRICATING MICRO ELECTRO MECHANICAL SYSTEM STRUCTURES

PRIORITY DATA

The present application is a Continuation application of U.S. patent application Ser. No. 13/353,765, filed Jan. 19, 2012, and issuing as U.S. Pat. No. 9,139,423, entitled "MICRO ELECTRO MECHANICAL SYSTEM STRUCTURES", hereby incorporated by reference in its entirety.

TECHNICAL FIELD

The present disclosure relates generally to the field of semiconductor package systems, and more particularly, to micro electro mechanical system (MEMS) structures.

BACKGROUND OF THE DISCLOSURE

Micro electro mechanical system (MEMS) structures are a recent development in the field of integrated circuit technology and include devices fabricated using semiconductor technology to form mechanical and electrical features. Examples of MEMS structures include gears, levers, valves, and hinges. Common applications of MEMS structures include accelerometers, pressure sensors, actuators, mirrors, heaters, and printer nozzles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

FIGS. 8A-8C are cross-sectional views of various stages of forming an exemplary MEMS structure according to some embodiments of this application.

DETAILED DESCRIPTION OF THE DISCLOSURE

Figure 1:
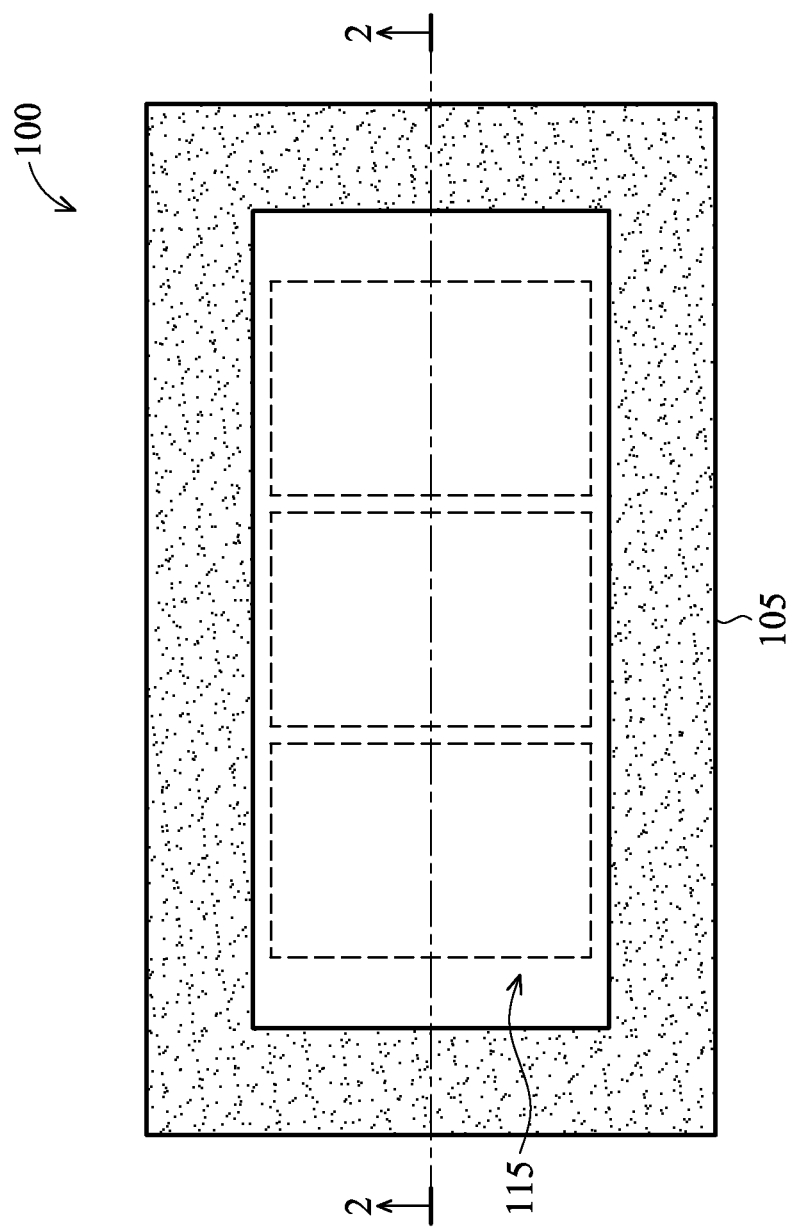
FIG. 1 is a schematic top view of an exemplary micro electro mechanical system (MEMS) structure according to some embodiments of this application.

Generally, a micro electrical mechanical system (MEMS) package system has a device substrate and a handle substrate that are bonded to each other. The device substrate has a MEMS device that is sealed in the device substrate and the handle substrate. To seal the MEMS device in the MEMS package system, a single bond pad ring of the device substrate is eutectically bonded with the handle substrate. The single bond pad ring of the device substrate may have a width of about 60 µm. To eutectically bond the bond pad rings of the device substrate and the handle substrate, a certain amount of thermal budget is used. If an insufficient amount of thermal budget is used, the bond pad rings do not completely react with each other. The incomplete eutectic reaction may result in the incomplete sealing of the MEMS device in the package and cause the malfunction of the MEMS device. The thermal budget, however, may result in a squish issue, e.g., metal melting and/or metal short, to complementary metal-oxide-semiconductor (CMOS) transistors.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a schematic top view of an exemplary MEMS structure according to some embodiments of this application. In FIG. 1, a MEMS structure 100 includes a bonding area 105 that is disposed around a MEMS device 115. The bonding area 105 is configured to seal the MEMS device 115 within the MEMS structure 100. In some embodiments, the bonding area 105 includes at least one bonding material, such as aluminum (Al), copper (Cu), silicon (Si), germanium (Ge), titanium (Ti), tantalum (Ta), gold (Au), nickel (Ni), tin (Sn), other suitable bonding materials, and/or any combinations thereof. In some embodiments, the MEMS device 115 includes an accelerometer, a gyroscope, a mirror for optical applications, a switch or a resonator within a radio frequency (RF) device, a rotational flexure, a translational flexure, and/or any suitable MEMS device.

Figure 2:
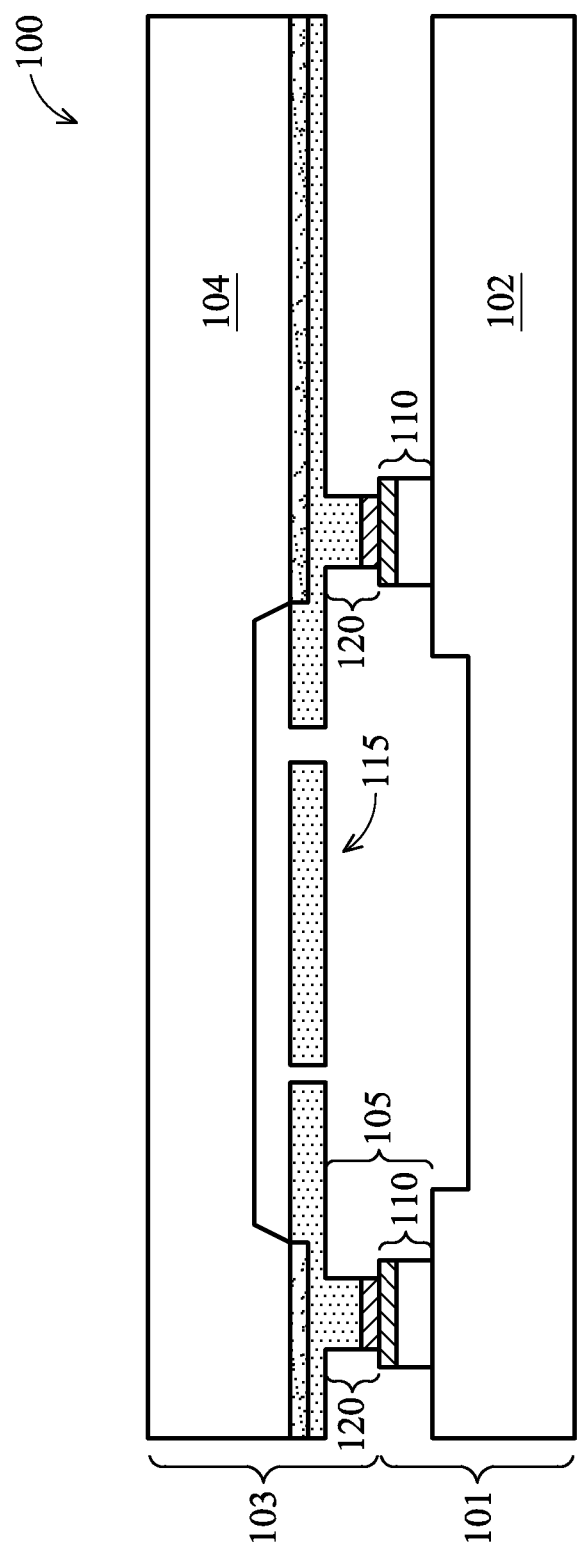
FIG. 2 is a cross-sectional view of an exemplar MEMS structure taken along a section line 2-2 shown in FIG. 1.

FIG. 2 is a cross-sectional view of the exemplar MEMS structure 100 taken along a section line 2-2 shown in FIG. 1. In FIG. 2, the MEMS structure 100 includes substrate structures 101 and 103 that are bonded to each other. In some embodiments, the substrate structures 101 and 103 are eutectically bonded, glass bonded, solder bonded, or bonded by any suitable process. It is noted that the substrate structures 101 and 103 each may include a single substrate or multiple substrates that are bonded with each other.

In some embodiments, the substrate structures 101 and 103 are assembled to form a hermetic or non-hermetic package system. In some embodiments, the substrate structures 101 and 103 include substrates 102 and 104, respectively. In some embodiments, the substrate 102 is referred to as a handle substrate and the substrate 104 is referred to as a device substrate. The device substrate 104 is provided with the MEMS device 115 therein.

In some embodiments, the substrates 102 and 104 each include a silicon substrate doped with a P-type or N-type dopant. In other embodiments, the substrates 102 and 104 each alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrates 102 and 104 each include an epitaxial layer (epi layer). The substrate 102 and 104 may be strained for performance enhancement, and may include a silicon-on-insulator (SOI) structure.

In some embodiments, the substrate structures 101 and/or 103 include at least one complementary metal-oxide-semiconductor (CMOS) integrated circuit, at least one MEMS circuit, at least one interposer structure, other integrated circuits, and/or any combinations thereof. In some embodiments, the interposer structure represents a substrate that may merely include a conductive wire routing for an electrical connection and be free from including any active device.

For example, the substrate structures 101 and/or 103 include an integrated circuit (not shown) formed thereon. In some embodiments, the integrated circuit is formed, for example, by CMOS technology. The integrated circuit includes, for example but not limited to, a logic circuit, an analog circuit, a mixed-signal circuit, and/or any suitable integrated circuit. In some embodiments, the integrated circuit includes an interconnect metallization structure (not shown) that is formed over the substrate 102 and/or 104. The interconnect metallization structure is configured to provide electrical interconnections among active devices and/or passive devices formed on and/or over the substrate 102 and/or 104.

In some embodiments, the interconnect metallization structure includes a plurality of metallization layers. The metallization layers each include at least one dielectric layer. The dielectric layer may include at least one material, such as silicon oxide, silicon nitride, silicon oxynitride, silicon carbide, silicon oxycarbide, low dielectric constant (low-k) dielectric material, ultra low-k dielectric material, other dielectric materials, or any combinations thereof.

In some embodiments, the interconnect metallization structure includes at least one conductive line, at least one contact plug, at least one via plug, at least one damascene structure, at least one dual damascene structure, at least one pad, other conductive structures, and/or any combinations thereof. In some embodiments, the interconnect metallization structure is made of at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable bonding materials, and/or any combinations thereof.

In some embodiments, at least one of the substrate structures 101 and 103 includes a bonding pad structure. For example, referring to FIG. 2 the substrate structure 101 includes a bonding pad structure 110. The substrate structure 103 includes a bonding pad structure 120. The bonding pad structures 110 and 120 are bonded to each other. The bonding area 105 includes the bonding pad structures 110 and 120. As shown in FIG. 1, the bonding pad structures 110 and 120 are disposed around the MEMS device 115.

In some embodiments, the bonding pad structures 110 and 120 each include a bonding material that is suitable for bonding. For example, the bonding pad structure 110 includes at least one semiconductor material, e.g., Ge, Si, silicon-germanium ($Si_xGe_{1-x}$), other semiconductor materials, and/or any combinations thereof. The bonding pad structure 120 includes at least one metallic material, e.g., Al, Cu, Ti, Ta, Au, Ni, Sn, other metallic materials, and/or any combinations thereof. In other embodiments, the bonding pad structures 110 and 120 each includes at least one metallic material, e.g., Al, Cu, Ti, Ta, Au, Ni, Sn, other metallic materials, and/or any combinations thereof. In some embodiments using a eutectic bonding, the bonding materials of the bonding substrates 110 and 120 are interacted with each other.

Figure 3B:
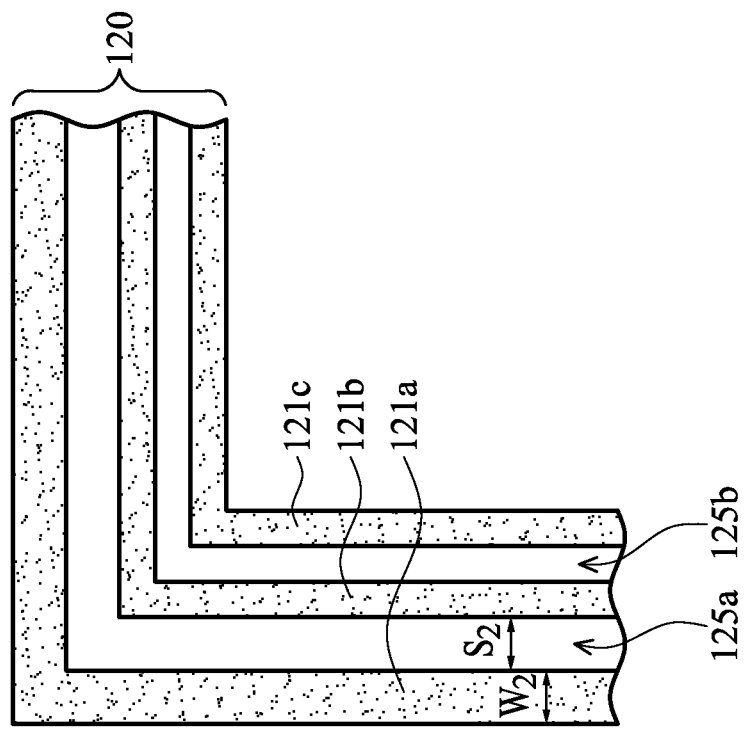
FIGS. 3A and 3B are schematic top views of exemplary bonding pad structures of a device substrate and a handle substrate according to some embodiments of this application.
Figure 3A:
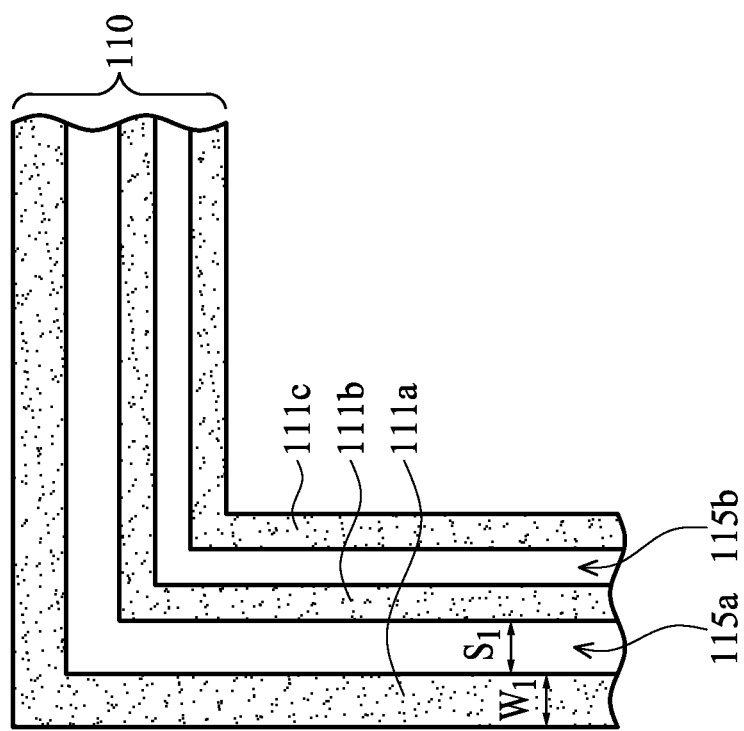

FIGS. 3A and 3B are schematic top views of exemplary bonding pad structures 110, 120 of a device substrate 104 and a handle substrate 102 (see FIG. 2) according to some embodiments of this application. In FIG. 3A, the bonding pad structure 110 includes at least one recess, e.g., slots 115a and 115b. The slots 115a and 115b each continuously extend in the bonding pad structure 110, such that the bonding pad structure 110 includes bond pad rings 111a-111c. In FIG. 3B, the bonding pad structure 120 includes at least one recess, e.g., slots 125a and 125b. The slots 125a and 125b each continuously extend in the bonding pad structure 120, such that the bonding pad structure 120 includes bond pad rings 121a-121c. The bond pad rings 121a-121c are separated from each other and disposed around the MEMS device 115 shown in FIG. 2. The bond pad rings 121a-121c are configured to bonded with the bond pad rings 111a-111c, respectively.

In some embodiments, the bond pad rings 111a-111c and 121a-121c each have a width $W_1$ and $W_2$. The width $W_1$ and $W_2$ each can be about 30 μm or less. In some embodiments, the slots 115a-115b and 125a-125b each have a space $S_1$ and $S_2$. The space $S_1$ and $S_2$ each can have a dimension of about 10 μm or less. It is noted that as the widths $W_1$ and $W_2$ of the bond pad rings 111a-111c and 121a-121c, respectively, are small (e.g., compared to the conventional 60 μm-wide single pad ring) the thermal budget to bond the bond pad rings 111a-111c and 121a-121c is lower than a thermal budget to bond the conventional 60 μm-wide single pad ring with the handle substrate. The lower thermal budget reduces the risk of melting down metallic lines in the CMOS device area. It is noted that the dimensions of the width and space of the bond pad rings and slots are merely exemplary. The scope of the application is not limited thereto. In some embodiments, the dimensions can be modified according to, for example, the use of the technology node.

It is noted that though showing slots 115a and 115b in FIG. 3A, and 125a and 125b in FIG. 3B, the scope of this application is not limited thereto. In some embodiments, the at least one recess of each of the bonding pad structures 110 and 120 includes a single slot. In other embodiments, the at least one recess includes more than two slots. It is noted that in some embodiments, the slots 115a, 115b, 125a and/or 125b do not continuously extend around the MEMS device 115. It is also noted that the at least one recess is not limited to slots. In some embodiments, the at least one recess includes at least one circle recess, oval recess, square recess, rectangular recess, other shapes of recesses, and/or any combinations thereof.

Figure 4:
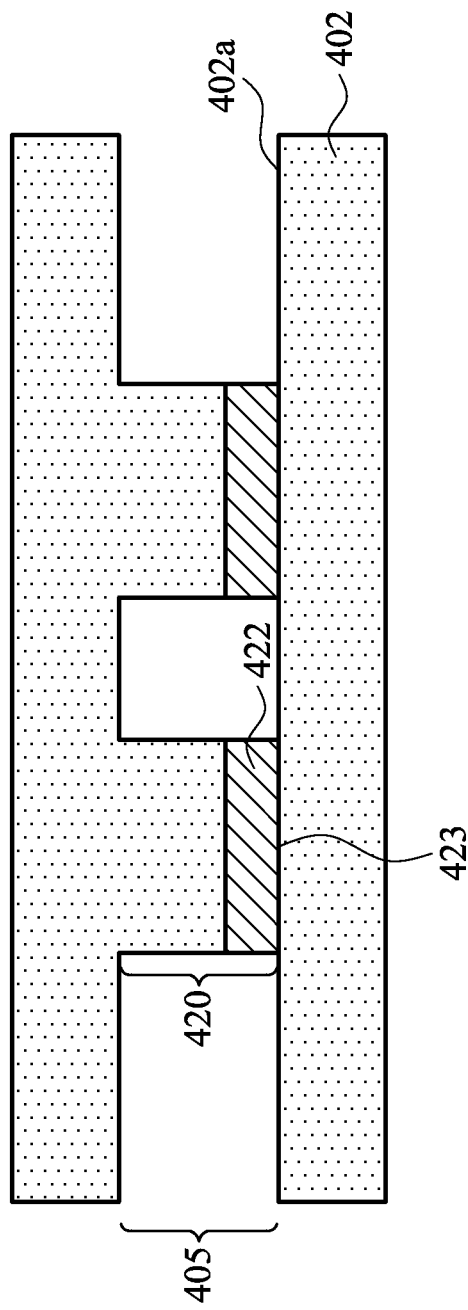
FIG. 4 is a schematic cross-sectional view of an exemplary bonding area according to some embodiments of this application.

FIG. 4 is a schematic cross-sectional view of another exemplary bonding area 105 according to some embodiments of this application. Items of FIG. 4 that are the same or similar items in FIG. 2 are indicated by the same reference numerals, increased by 300. In FIG. 4, the bonding area 405 includes bonding pad structure 420 that is bonded to a substrate 402. In some embodiments, the substrate 402 includes at least one semiconductor material, e.g., Ge, Si, silicon-germanium ($Si_xGe_{1-x}$), other semiconductor materials, and/or any combinations thereof. The bonding pad structure 420 includes a bonding material 422. In some embodiments, the bonding material 422 is made of at least one metallic material, e.g., Al, Cu, Ti, Ta, Au, Ni, Sn, other metallic materials, and/or any combinations thereof. In FIG. 4, a surface 402a of the substrate 402 is substantially level with an interface 423 between the bonding pad structure 420 and the substrate 402.

Figure 5:
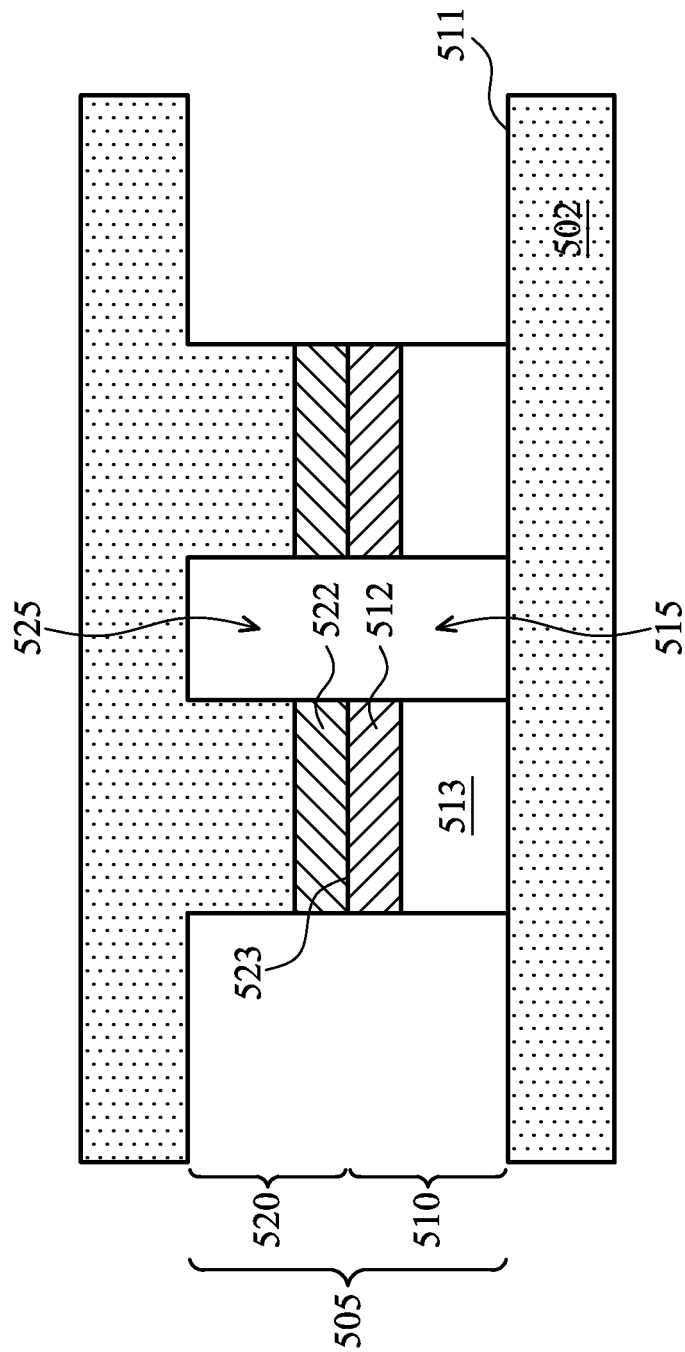
FIG. 5 is a schematic cross-sectional view of another exemplary bonding area according to some embodiments of this application.

FIG. 5 is a schematic cross-sectional view of another exemplary bonding area 105 according to some embodiments of this application. Items of FIG. 5 that are the same or similar items in FIG. 2 are indicated by the same reference numerals, increased by 400. In FIG. 5, the bonding area 505 includes bonding pad structures 510 and 520 that are bonded to each other. In some embodiments, the bonding pad structures 510 and 520 have at least one recess, e.g., slots 515 and 525, respectively. In some embodiments, the slots 515 and 525 are substantially aligned with each other and disposed around a MEMS device. The at least one recess of the bonding pad structure 510 and 520 can be as same as or similar to the at least one recess of the bonding pad structures 110 and 120 described above in conjunction with FIGS. 3A and 3B, respectively.

In some embodiments, the bonding pad structure 510 includes a bonding material 512 that is disposed over a dielectric material 513. The dielectric material 513 includes, for example, silicon oxide, silicon nitride, silicon oxynitride, silicon carbide, silicon oxycarbide, silicon carbon nitride, low dielectric constant (low-k) dielectric material, ultra low-k dielectric material, other dielectric materials, and/or any combinations thereof. In some embodiments, the bonding material 512 includes at least one metallic material, e.g., Al, Cu, Ti, Ta, Au, Ni, Sn, other metallic materials, and/or any combinations thereof.

Referring again to FIG. 5, in some embodiments the bonding pad structure 520 includes a bonding material 522. The bonding material 522 includes at least one metallic material, e.g., Al, Cu, Ti, Ta, Au, Ni, Sn, other metallic materials, and/or any combinations thereof. In FIG. 5, an interface 523 between the bonding pad structures 510 and 520 is not level with a surface of the substrate 502. In some embodiments, the surface area of the bonding pad structure 510 is substantially equal to the surface area of the bonding pad structure 520 that is bonded thereto.

Figure 6:
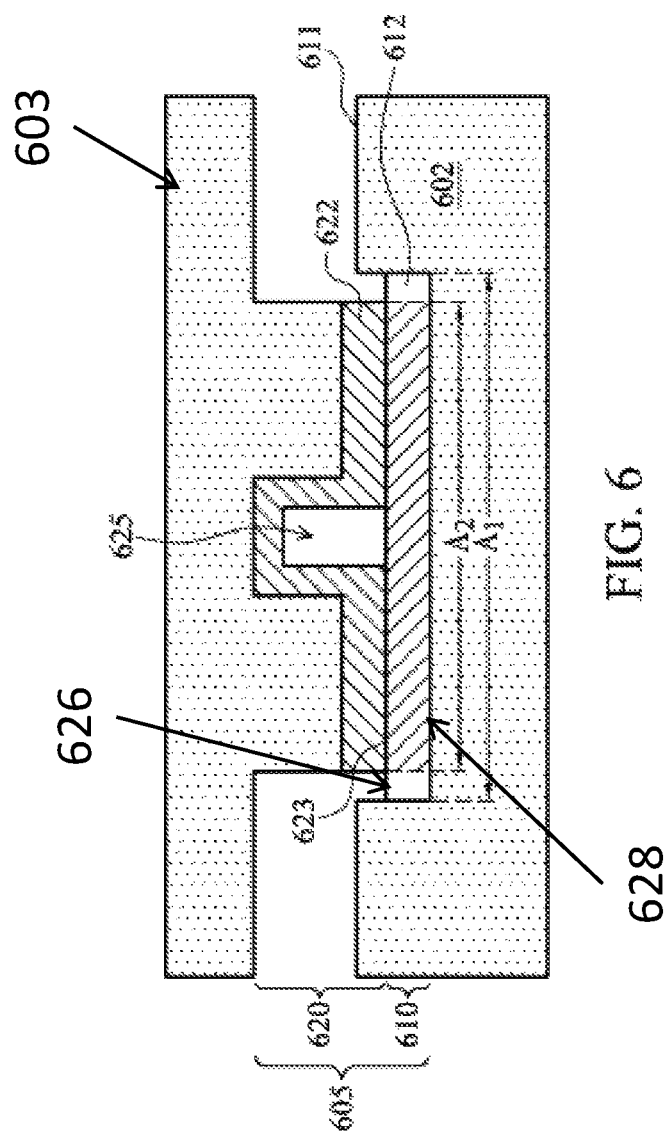
FIG. 6 is a schematic cross-sectional view of an exemplary bonding area according to some embodiments of this application.

FIG. 6 is a schematic cross-sectional view of another exemplary bonding area 105 of FIG. 2 according to some embodiments of this application. Items of FIG. 6 that are the same or similar items in FIG. 2 are indicated by the same reference numerals, increased by 500. In FIG. 6, the bonding area 605 includes bonding pad structures 610 and 620 that are bonded to each other. Bonding pad structure 610 (i.e., structure 110 of FIG. 2) is disposed on substrate 602 (i.e., substrate 102 of FIG. 2); bonding pad structure 620 (i.e., structure 120 of FIG. 2) is disposed on substrate structure 603 (i.e., substrate structure 103 of FIG. 2).

In some embodiments, the bonding pad structures 610 and 620 include bonding materials 612 and 622, respectively. The bonding material 612 is disposed over a substrate 602. The bonding material 622 is disposed in and continuously extends along walls of a recess 625 that is within the bonding pad structure 620. In some embodiments, the bonding material 622 is disposed in the recess 625, but does not continuously extend along the walls of the recess 625. In other embodiments, the bonding material 622 is not disposed in the recess 625.

In some embodiments, the bonding materials 612 and 622 each include at least one metallic material, e.g., Al, Cu, Ti, Ta, Au, Ni, Sn, other metallic materials, and/or any combinations thereof. In FIG. 6, an interface 623 between the bonding pad structures 610 and 620 is not level with a surface 611 of the substrate 602. In some embodiments, the interface 623 is below the surface 611 of the substrate 602. The interface 623 is formed by the physical interface created by mating (e.g., bonding) of respective surfaces of the bonding materials 612 and 622 respectively. As illustrated in FIG. 6, the interface 623 is below the surface 611 as the bonding material 612 is disposed in a trench 626 of the substrate 602. The trench 626 extends from the surface 611 to a second surface 628 of the substrate 602. The recess 625 interposes first and second portions of the interface 623 (left and right portions of interface 623 with respect to recess 625). As illustrated in FIG. 6, the recess 625 provides respective regions of the bonding materials 622, 612 that are surfaces not physically interfacing one another (i.e., are not physically bonded to one another) as the recess 625 is over and vertically collinear with a portion of the bonding material 612. As illustrated in FIG. 6, the portion of the bonding material 612 under the recess 625 is coplanar with the interface 623 (provided by the bonding of the surface of bonding material 612 and the surface of bonding material 622), but is not physical interfacing the bonding material 622.

Referring again to FIG. 6, the bonding pad structures 610 and 620 have respective surface areas $A_1$ and $A_2$ that are configured for bonding. In some embodiments, the surface area $A_2$ is smaller than the surface area $A_1$. It is noted that though showing the surface area difference, the scope of this application is not limited thereto. In some embodiments, the surface area $A_1$ is substantially equal to the surface area $A_2$. In other embodiments, the surface area $A_1$ is smaller than the surface area $A_2$.

Following are descriptions regarding an exemplary method of forming the MEMS structure described above in conjunction with FIG. 1. It is noted the method described below is merely exemplary. The scope of this application is not limited thereto.

Figure 7:
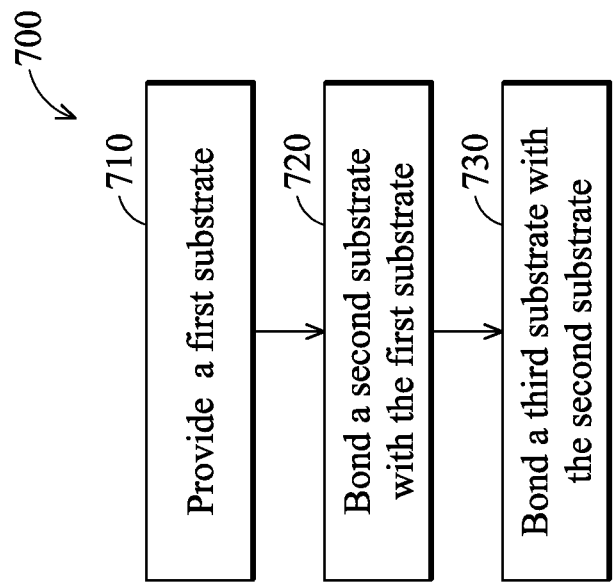
FIG. 7 provides a flow chart illustrating an exemplary method for fabricating a MEMS structure.
Figure 8C:
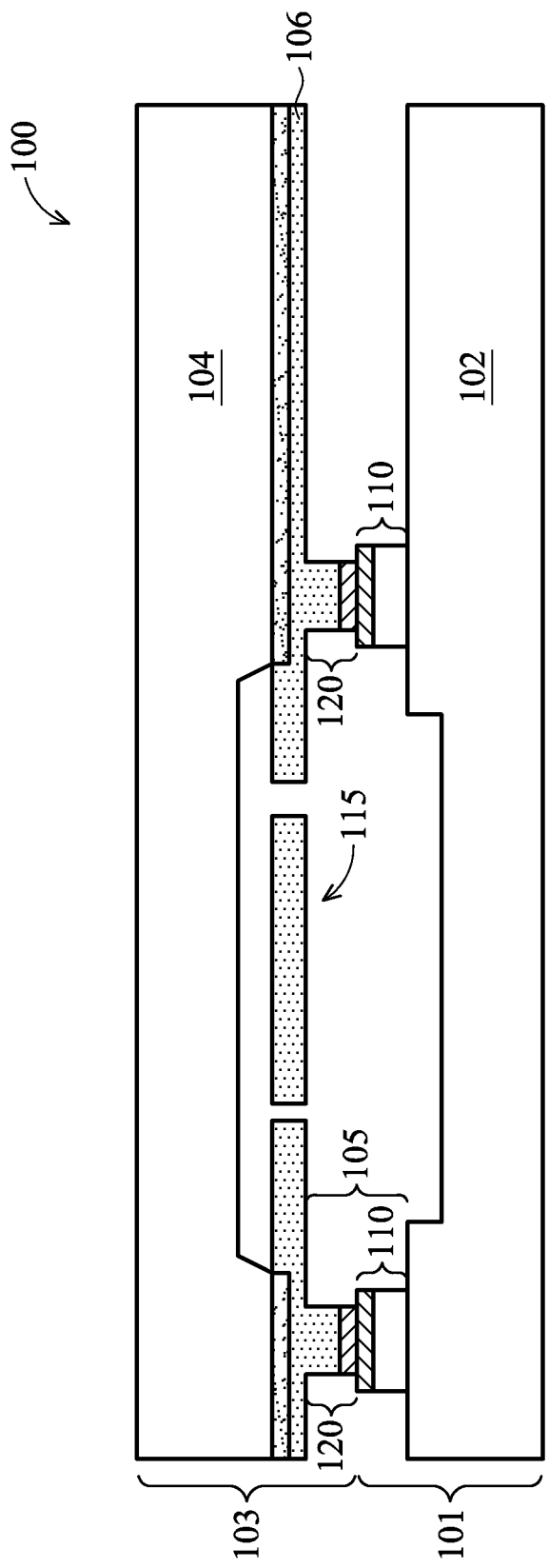

FIG. 7 provides a flow chart illustrating an exemplary method 700 for fabricating a MEMS structure. FIGS. 8A-8C are cross-sectional views of various stages of forming the MEMS structure according to the method 700. It is understood that additional steps can be provided before, during, and after the method 700, and some of the steps described below can be replaced or eliminated for additional embodiments of the method. It is further understood that additional features can be added in the MEMS structure 100 and some of the features described below can be replaced or eliminated for additional embodiments of the MEMS structure 100. The method 700 and the corresponding MEMS structure 100 are exemplary only and not intended to be limiting.

Referring to FIG. 7, at block 710, a first substrate is provided, for example, a first substrate 104 as illustrated in FIG. 8A. As noted, the substrate 104 can be a semiconductor substrate that includes an elementary semiconductor including silicon and/or germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the substrate may be a semiconductor on insulator (SOI). In some examples, the substrate 104 includes a doped epi layer. In other examples, the substrate 104 includes a multilayer compound semiconductor structure. Alternatively, the substrate 104 includes a non-semiconductor material, such as a glass, fused quartz, or calcium fluoride. In the present example, the substrate 104 comprises silicon.

In some embodiments, the substrate 104 includes an integrated circuit, or portion thereof, that comprises memory cells, analog circuits, logic circuits and/or mixed-signal circuits (not shown). The substrate 104 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. In an example, the substrate 104 includes one or more CMOS devices, such as transistors (e.g., NMOS and/or PMOS transistors). In some embodiments, the substrate 104 includes circuitry associated with the transistors such as interconnect layers (e.g., metal lines and vias) and interlayer dielectric (ILD) layers. In some embodiments, the substrate 104 also includes isolation structures and/or any other elements associated with integrated circuitry.

Referring to FIG. 7, at block 720, a second substrate is bonded with the first substrate. For example, the substrate 106 is bonded with the substrate 104 as illustrated in FIG. 8A. In some embodiments, the material of the substrate 106 is similar to that of the substrate 104 described above. In some embodiments, the substrate 106 includes the MEMS device 115 in whole or in part. It is understood that the MEMS device 115 can be constructed before or after the substrate 106 is bonded to the substrate 104. In some embodiments, the MEMS device 115 includes a plurality of elements formed of metal, polysilicon, dielectric, and/or other materials known in the art. The MEMS device 115 can include materials typically used in a conventional CMOS fabrication process. Many configurations of the MEMS device 115 are possible, depending on the desired functionality. One or more of the elements depicted above can be designed to provide MEMS mechanical structures. The MEMS mechanical structures may include structures or elements operable for mechanical movement. The MEMS device 115 can be formed using typical processes used in CMOS fabrication, for example, photolithography, etching processes (e.g., wet etch, dry etch, plasma etch), deposition processes, plating processes, and/or other suitable processes. In an embodiment, the MEMS device 115 includes a motion sensor (e.g., a gyroscope, an accelerometer, etc.), a radio frequency (RF) MEMS device (e.g., an RF switch, filter, etc.), an oscillator, a MEMS microphone, or any other MEMS type device.

In some embodiments, the substrates 104 and 106 are bonded together by any suitable method, such as fusion or eutectic bonding processes. For example, the fusion bonding process involves bringing the substrates 104 and 106 into intimate contact, which causes the substrates 104 and 106 to hold together due to atomic attraction forces (i.e., Van der Waal forces). The substrates 104 and 106 are then subjected to an annealing process, after which a solid bond may be formed between the substrates 104 and 106. A temperature for the annealing process may be any suitable temperature, such as between about 200° C. and about 350° C. The fusion bonding process can arise from $SiO_2$/Si bonding, Si/Si bonding, and/or other suitable bonding. In some embodiments, the oxide can include high density plasma (HDP) oxide, tetraethylorthosilicate (TEOS) oxide, or plasma enhanced TEOS (PETEOS) oxide.

In some embodiments, the eutectic bonding process is applied between any alloys suitable for the bonding temperature boundary condition. For example, the eutectic bonding process includes metal/metal bonding and/or metal/semiconductor bonding, such as Ge/Al bonding, Ge/Au bonding, Si/Au bonding, Si/Al bonding, and/or other suitable bonding. If the bonding process involves a substrate including CMOS devices, one may control the bonding temperature near or lower than CMOS device temperature. The eutectic bonding processes may occur at high pressure and at any suitable temperature, such as between about 400° C. and 450° C.

Referring again to FIG. 7, at block 730, a third substrate is bonded with the second substrate. For example, the substrate structure 101 shown in FIG. 8B is provided. As noted, the substrate structure 101 includes the bonding pad structure 110 disposed over the substrate 102. The material of the substrate 102 can be similar to that of the substrate 104 described above. The substrate 102 is bonded with the substrate 106 through the bonding pad structure 110. In some embodiments, the bonding pad structure 110 includes a bonding material that is suitable for bonding. For example, the bonding pad structure 110 includes at least one semiconductor material, e.g., Ge, Si, silicon-germanium ($Si_xGe_{1-x}$), other semiconductor materials, and/or any combinations thereof. In some embodiments, the bonding pad structure 110 includes at least one metallic material, e.g., Al, Cu, Ti, Ta, Au, Ni, Sn, other metallic materials, and/or any combinations thereof.

In some embodiments, the substrate structures 101 and 103 are eutectically bonded to each other. In some embodiments, the eutectic bonding process can be applied between any alloys suitable for the bonding temperature boundary condition. For example, the eutectic bonding process may include metal/metal bonding and/or metal/semiconductor bonding, such as Ge/Al bonding, Ge/Au bonding, Si/Au bonding, Si/Al bonding, and/or other suitable bonding. If the bonding process involves a substrate including CMOS devices, one may control the bonding temperature near or lower than CMOS device temperature limitations. The eutectic bonding processes may occur at high pressure and at any suitable temperature, such as between about 400° C. and 450° C.

In a first exemplary embodiment, a micro electro mechanical system (MEMS) structure includes a first substrate structure including a bonding pad structure. The bonding pad structure has at least one recess therein. A second substrate structure is bonded with the bonding pad structure of the first substrate structure.

In a second exemplary embodiment, a micro electro mechanical system (MEMS) structure includes a device substrate having a MEMS device. The device substrate includes a first bond pad ring and a second bond pad ring disposed around the MEMS device. A handle substrate includes a bonding pad structure. The bonding pad structure is bonded with the first bond pad ring and the second bond pad ring.

In a third exemplary embodiment, a micro electro mechanical system (MEMS) structure includes a device substrate having a MEMS device. The device substrate includes a first bond pad ring and a second bond pad ring disposed around the MEMS device. The first bond pad ring and the second bond pad ring each include at least one metallic material. A handle substrate is bonded with the first bond pad ring and the second bond pad ring. The handle substrate includes at least one semiconductor-containing material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a device comprising:
providing a first substrate structure including a first bonding pad structure having a first bonding material that defines a first bonding surface and a second bonding surface having a recess interposing the first and second bonding surfaces;
providing a second substrate and a second bonding pad structure on the second substrate, wherein the second bonding pad structure includes a second bonding material disposed in a trench recessed from a top surface of the second substrate; and
bonding the first bonding material to the second bonding material such that the first bonding surface bonds to the second bonding material to form a first portion of the bonding interface and the second bonding surface bonds to the second bonding material to form a second portion of the bonding interface, the recess interposing the first and second portions, wherein the first and second portions of the bonding interface are disposed within the trench and wherein at least a portion of the recess extends above the trench.

2. The method of claim 1, wherein the bonding provides for a surface region of the second bonding material that does not form a physical interface with the first bonding material, the surface region being vertically collinear with the slot.

3. The method of claim 2, wherein the surface region of the second bonding material is coplanar with the first and second portions of the bonding interface.

4. The method of claim 1, wherein a width of the first portion of the bonding interface is about 30 microns or less.

5. The method of claim 1, wherein a width of the recess is about 10 microns or less.

6. The method of claim 1, wherein the first bonding material continuously extends from the first bonding surface to the second bonding surface.

7. The method of claim 1, wherein the bonding is a eutectic bonding process.

8. The method of claim 1, wherein the bonding is a semiconductor to metal eutectic bonding process.

9. The method of claim 1, wherein the bonding is by a fusion bonding process.

10. The method of claim 1, wherein the first bonding material includes at least one of Al, Cu, Ti, Ta, Au, Ni, or Sn.

11. The method of claim 1, wherein the second bonding material includes at least one of Al, Cu, Ti, Ta, Au, Ni, or Sn.

12. The method of claim 1, wherein a width of the first portion of the bonding interface is about 30 microns or less and a width of the recess is about 10 microns or less.

13. The method of claim 1, wherein the first bonding material extends along walls of the recess.

14. A method of fabricating a device comprising:
providing a first substrate structure having a first bonding material that defines a first bonding surface and a second bonding surface having at least one slot interposing the first and second bonding surfaces;
providing a second substrate structure including a second bonding material, wherein the second bonding material disposed in a trench recessed from a top surface of the second substrate; and
bonding the first bonding material to the second bonding material such that the first bonding surface bonds to the second bonding material to form a first portion of the bonding interface and the second bonding surface bonds to the second bonding material to form a second portion of the bonding interface, the at least one slot interposing the first and second portions; where the first and second portions of the bonding interface are disposed within the trench and form bond pad rings.

15. The method of claim 14, wherein the at least one slot is two slots that extend at least partially above the trench.

16. The method of claim 14, wherein the bonding is a eutectic bonding process.

17. The method of claim 14, wherein the bonding is a semiconductor to metal eutectic bonding process.

18. The method of claim 14, wherein the bonding is by a fusion bonding process.

19. The method of claim 18, wherein the fusion bonding process includes an annealing process.

20. A method of fabricating a device comprising:
providing a first substrate having a first bonding material that defines a first bonding surface and a second bonding surface having a slot interposing the first and second bonding surfaces;
providing a second substrate including a second bonding material disposed in a trench recessed from a top surface of the second substrate, wherein the second bonding material extends from a first sidewall of the trench to a second sidewall of the trench; and
bonding the first bonding material to the second bonding material such that the first bonding surface bonds to the second bonding material to form a first portion of a bonding interface and the second bonding surface bonds to the second bonding material to form a second portion of the bonding interface, the slot interposing the first and second portions, wherein the first and second portions of the bonding interface are disposed within the trench and wherein at least a portion of the slot extends above the trench.

* * * * *